(12) United States Patent
Singh et al.

(10) Patent No.: US 6,457,157 B1
(45) Date of Patent: Sep. 24, 2002

(54) I/O DEVICE LAYOUT DURING INTEGRATED CIRCUIT DESIGN

(75) Inventors: Virinder Singh, Fremont; Mike Liang, Milpitas, both of CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/492,881

(22) Filed: Jan. 26, 2000

Related U.S. Application Data

(62) Division of application No. 09/062,254, filed on Apr. 17, 1998, now Pat. No. 6,057,169.

(51) Int. Cl.[7] .............................................. G06F 17/50
(52) U.S. Cl. ................................ 716/2; 716/10; 438/14
(58) Field of Search ............... 716/2, 8–14; 438/14–17, 438/5, 6, 599, 800, 128, 129

(56) References Cited

U.S. PATENT DOCUMENTS

| | | | |
|---|---|---|---|
| 4,745,305 A | 5/1988 | Crafts | 307/407 |
| 5,155,065 A | 10/1992 | Schweiss | 437/209 |
| 5,552,333 A | 9/1996 | Cheung et al. | 437/51 |
| 5,581,109 A | * 12/1996 | Hayashi et al. | 257/503 |
| 5,777,354 A | * 7/1998 | Cheung et al. | 257/202 |
| 6,127,208 A | * 10/2000 | Amiya et al. | 438/129 |
| 6,130,550 A | * 10/2000 | Zaliznyak et al. | 326/39 |

OTHER PUBLICATIONS

Caldwell et al, "Implications of Area–Array I/O For–Based Placement Methodology," IEEE, Feb. 1998, pp. 1–7.*

* cited by examiner

*Primary Examiner*—Vuthe Siek
(74) *Attorney, Agent, or Firm*—Mitchell Silberberg & Knupp, LLP

(57) ABSTRACT

A method for laying out input/output (I/O) pairs, each including an I/O cell and a pad, on an integrated circuit die. Size information is obtained for each of a first I/O pair and a second I/O pair. A minimum pad spacing criterion is obtained which specifies a minimum distance between the pad in the first I/O pair and an element of the second I/O pair, and the first I/O pair and the second I/O pair are laid out so as to satisfy the minimum pad spacing criterion. Also provided is a method for laying out pads for input/output (I/O) cells on an integrated circuit die in which size information is obtained for each of a first I/O cell pad and a second I/O cell pad. A minimum pad spacing criterion is obtained, and the first I/O cell pad and the second I/O cell pad are laid out so as to satisfy the minimum pad spacing criterion.

12 Claims, 11 Drawing Sheets

I/O DEVICE LAYOUT DURING INTEGRATED CIRCUIT DESIGN

This application is a divisional application of United States application Ser. No. 09/062,254, filed Apr. 17, 1998 now U.S. Pat. No. 6,057,169 and allowed on Dec. 6, 1999.

BACKGROUND OF THE INVENTION

1. Field of the Invention.

The present invention generally relates to the art of microelectronic integrated circuit design, and particularly relates to layout of input/output devices on an integrated circuit die.

2. Description of the Related Art.

FIG. 1 provides a representational illustration of a typical integrated circuit (IC) chip (or die) 10 which includes a semiconductor substrate 12, upon which are formed the electronic devices used to implement the chip's functionality. The logic circuitry of the integrated circuit is formed on the interior portion 20 of the semiconductor substrate 12. The logic portion includes a number of functional circuit blocks that can have different sizes and shapes. The larger blocks can include, for example, central processing units such as CPU 21, read-only memories such as ROM 22, clock/timing units such as clock/timing unit 23, random access memories such as RAMs 24, and I/O units such as I/O unit 25 for providing an interface between CPU 21 and peripheral devices. These blocks, commonly known as macroblocks, can be considered as modules for use in various circuit designs, and are represented as standard designs in circuit libraries. The logic portion further includes tens of thousands, hundreds of thousands or even millions or additional small cells 26. Each cell 26 represents a single logic element, such as a gate, or several logic elements interconnected in a standardized manner to perform a specific function. Cells that consist of two or more interconnected gates or logic elements are also available as standard modules in circuit libraries.

Along the periphery of the semiconductor substrate are various input, output or combined input and output (input/output or I/O) devices or cells 16., In a wire-bond IC chip, each such I/O device generally has connected to it at least one metal bonding pad 18 which is used as an electrical connection for an input/output signal. The wire-bond IC die is then mounted within a plastic or ceramic package having multiple pins, and wire connections are made between the die's bonding pads and the package's pins. Finally, the package containing the IC die is mounted onto a printed circuit board in a manner so as to form electrical connections between the pins of the IC and other components on the printed circuit board. In this manner, external signals can be provided to and from the IC die.

Certain of pads 18 are connected to external power (VDD) and ground (VSS). Each such pad is connected to a power I/O cell, which in turn is connected to one of the chip's power and ground rings, respectively. More specifically, power ring 30 and ground ring 31 supply power and ground to the I/O circuitry. Similarly, power ring 32 and ground ring 33 provide power and ground to the internal logic circuitry 20. In order to isolate the internal logic power circuit from the I/O power circuit, certain pad and power I/O cell combinations are connected only to the internal logic power/ground rings, and separate pad and power I/O cell combinations are connected only to the I/O circuit power/ground rings. To further isolate the power/ground supplies for certain sensitive circuits from the power/ground supplies for noisier circuits, cuts are made in the rings (not shown). Each resulting ring segment can then be used to supply a different type of circuit. Also, although only a single I/O power ring is shown, mixed-voltage integrated circuits may utilize a different power ring for each different voltage.

During the physical design stage of conventional IC design, I/O devices. 16, internal logic blocks 21–24 and internal logic cells 26 typically are laid out on the semiconductor substrate in such a manner as to make the most efficient use of the available die space, as well as to permit the routing of required connections between the various devices. However, upon completion of physical design and implementation of design rule checking, it was sometimes discovered that the design was not feasible for actual implementation because one or more bonding pads 18 had been placed too close to either neighboring pads or neighboring pad wires (i.e., the wire connecting an I/O device and its pad). In particular, it often was discovered that, due to fabrication limitations, fabrication of the integrated circuit was likely to result in unwanted short circuits. Upon discovering such problems, it was then necessary to go back and revise the physical design, often at significant expense and delay, in order to attempt to eliminate the problem.

SUMMARY OF THE INVENTION

The present invention addresses the foregoing situation by imposing minimum pad spacing criteria for the layout of I/O devices and pads.

According to one aspect, the invention lays out input/output (I/O) pairs, each including an I/O cell and a pad, on an integrated circuit die. Size information is obtained for each of a first I/O pair and a second I/O pair. A minimum pad spacing criterion is obtained which specifies a minimum distance between the pad in the first I/O pair and an element of the second I/O pair, and the first I/O pair and the second I/O pair are laid out so as to satisfy the minimum pad spacing criterion.

According to a further aspect, the invention lays out input/output (I/O) pairs, each including an I/O cell and a pad, on an integrated circuit die. Size information is obtained for each of the I/O pairs. Minimum pad spacing criteria are obtained, including a required minimum center-to-center spacing between two pads in a same row and a required minimum distance between closest edges of two pads in a same row. Each of the I/O pairs are then laid out so as to satisfy the minimum pad spacing criteria According to a still further aspect, the invention lays out pads for input/output cells on an integrated circuit die. Size information is obtained for each of a first I/O cell pad and a second I/O cell pad. A minimum pad spacing criterion is obtained, and the first I/O cell pad and the second I/O cell pad are laid out so as to satisfy the minimum pad spacing criterion.

By virtue of the foregoing arrangements, the present invention frequently can avoid fabrication problems that might result in undesirable short circuits and that might not otherwise be discovered until later in the design process. As a result, the invention can often avoid the cost and delay of having to perform physical redesigns.

According to more particularized aspects of the invention, pads are staggered in at least two different rows, and the minimum pad spacing criteria also include a required minimum distance between the closest edges of the current pad and the wire corresponding to the a next subsequent pad in a higher row than that of the current pad. This aspect of the invention often can provide additional protection against fabrication problems.

The foregoing summary is intended merely to provide a quick understanding of the general nature of the invention. A more complete understanding of the invention can be obtained by referring to the claims and the following detailed description of the preferred embodiments in connection with the accompanying figures.

DESCRIPTION OF THE PREFERRED EMBODIMENTS

The Design Cycle

Figure 1:
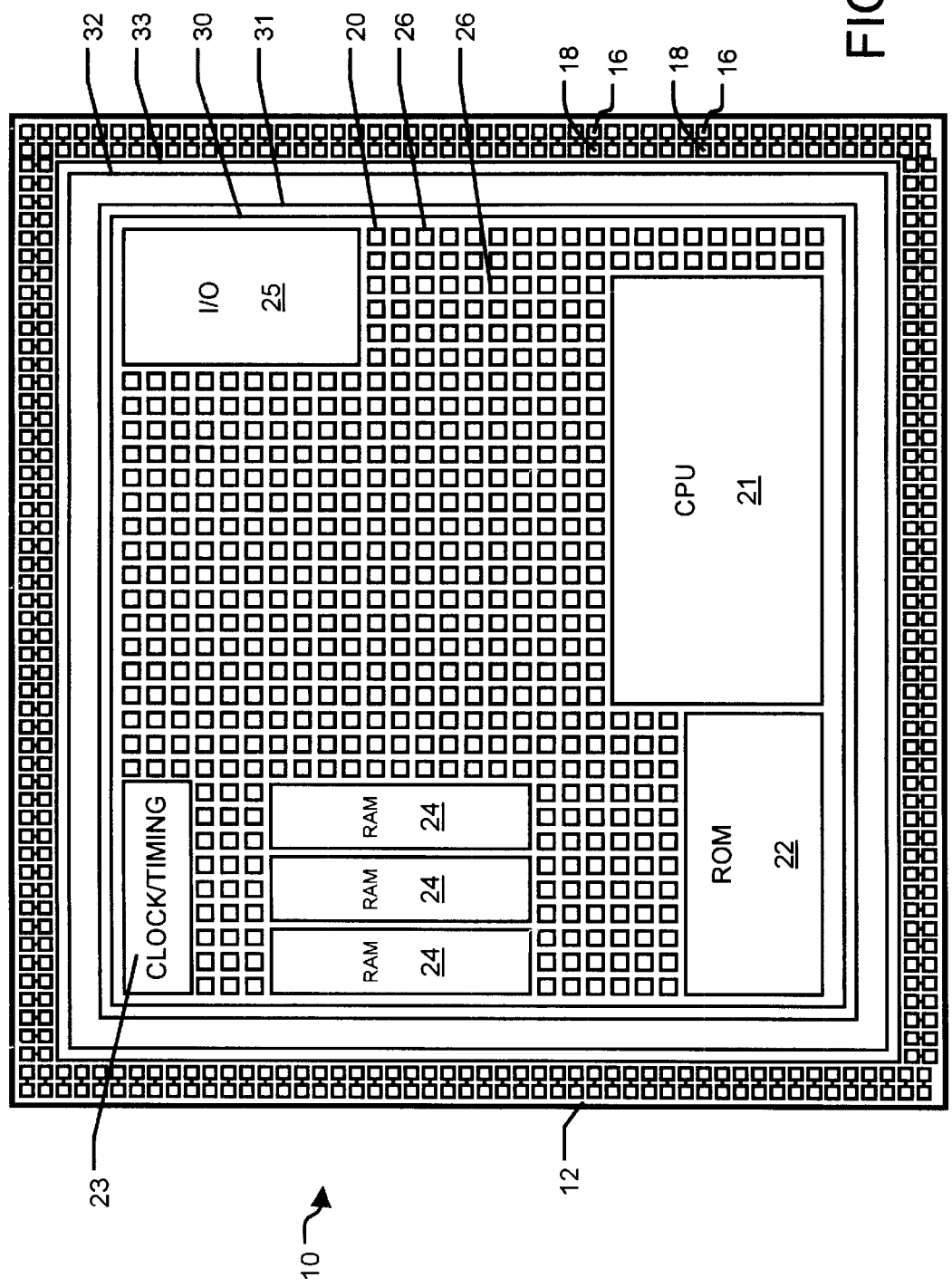
FIG. 1 provides a representational illustration of a conventional integrated circuit
Figure 2:
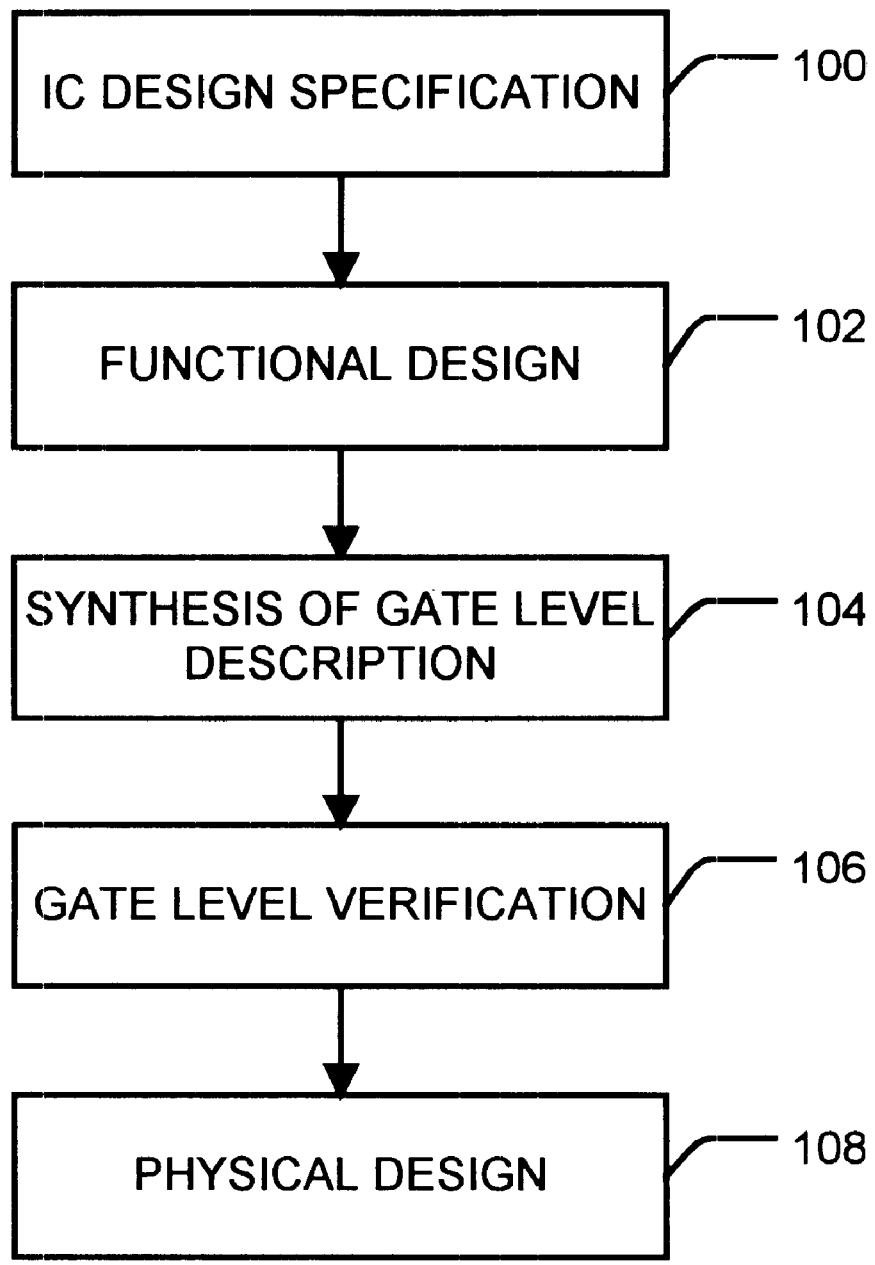
FIG. 2 is a flow diagram for explaining an integrated circuit chip design cycle according to a representative embodiment of the invention.

FIG. 2 illustrates a flow diagram for providing a brief overview of IC chip design according to a representative embodiment of the invention. Briefly, according to FIG. 2, an IC design specification is prepared; a functional description of a system corresponding to the design specification is produced; a gate-level circuit description is synthesized from the functional description; a simulation is performed to verify the feasibility of the gate-level description; and physical design is performed.

In more detail, in step 100 an IC design specification is prepared. At this initial step of the design cycle, the desired system design is described in the highest level of abstraction. Subsequent steps in the design cycle provide successively more detail until all information required to fabricate the chip has been derived. Preferably, the design specification dictates features such as performance criteria, required external interfaces and protocols, and product cost targets.

In step 102, a functional design is produced Specifically, the functional design describes a system that will satisfy the IC design specification prepared in step 100. Preferably, the functional design is written using a highly structured syntax so as to permit subsequent steps in the design cycle to be performed using automated computer-aided design (CAD) tools More preferably, the functional design is written in a hardware description language (HDL) such as VHDL (IEEE standard 1076–1993) or Verilog-HDL.

In step 104, a description of a gte-level circuit is synthesized based on the HDL code produced in step 102. Preferably, gate-level design is performed by running an automated synthesis tool on the HDL code. Upon execution of the synthesis tool, physically realizable gates and flip-flops are selected from a pre-defined library and are interconnected in a manner so as to satisfy the relationships and to perform the processing defined by the HDL code. Processing by the synthesis tool preferably utilizes pre-defined user design constraints which have been formulated in an effort to enhance the feasibility of the design, particularly with respect to problems which might otherwise not be discovered until later in the design cycle. The format of the gate-level circuit description synthesized in step 104 is a "netlist", which categorizes a number of "nets", each including one or more gates and/or flip-flops, and which also describes the interconnections between these nets.

In gate-level verification step 106, a computer simulation is run to test the circuit design synthesized during gate-level design step 104. The goals of this simulation are to determine whether all performance criteria have been met and whether any timing or other circuit errors will occur in response to a variety of different input signals and conditions. Upon completion of gate-level verification is step 106, the netlist is provided to physical design step 108. In addition, a dump of top-level signals contained in the netlist is provided to the user for the user to designate an order in which the signals will be implemented on the chip, as described in more detail below.

In physical design step 108, the netlist generated in step 106 is mapped to information for physically implementing the corresponding circuit on an IC die. The objective of physical design is to determine an optimal arrangement of devices in a plane or in a three-dimensional space, and an efficient interconnection or routing scheme between the devices to obtain the desired functionality. One goal of physical design step 108 is to implement the design using minimum chip area. Other factors considered during physical design include thermal generation, electromagnetic effects and the number of metal layers available for wire routing.

Step 108 produces a set of design files in an unambiguous representation known as an intermediate form that describes the layout The design files are then converted into pattern generator files that are used to produce patterns called masks by an optical or electron beam pattern generator. The preferred implementation of physical design step 108 is discussed below in more detail in connection with FIG. 3.

It should be noted that while the foregoing design cycle is preferred, variations of the foregoing may also be used, as will be apparent to those skilled in the art In addition, although the foregoing design process is described above and shown in FIG. 2 as being purely sequential, many times one or more of the steps will need to be repeated. That is, if the design is found to be unfeasible at one step, an earlier step might need to be re-executed to correct the problem. For example, it might occur that in step 104 a gate-level description can not be generated to satisfy the functional design requirements using the available technology library, while at the same time maintaining the user's design constraints. In this case, the functional description may need to be redesigned in step 102 in order to achieve a feasible design.

Physical Design

Figure 3:
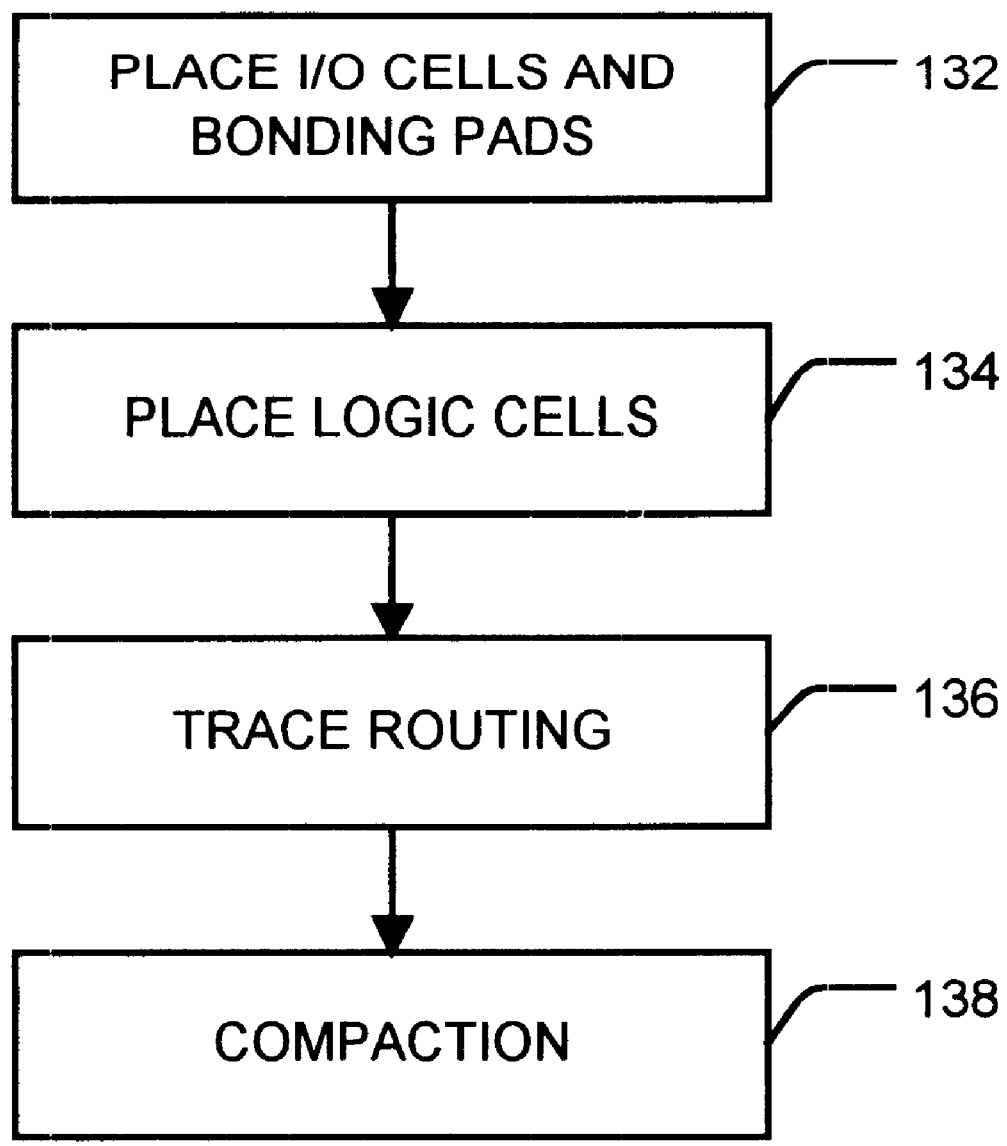
FIG. 3 is a flow diagram for describing the physical design phase of integrated circuit design according to a representative embodiment of the invention.

A more detailed discussion of physical design step 108 (shown in FIG. 2) in the preferred embodiment of the invention will now be discussed with reference to the flow diagram shown in FIG. 3. Briefly, according to FIG. 3, I/O cells and associated bonding pads are laid out around the periphery of the die; interior logic cells are laid out; traces are routed between the cells and from the cells to the power and ground rings; and compaction is performed.

In more detail, in step 132 the I/O cells and corresponding bonding pads are laid out (or placed) around the periphery of the die. This step is discussed in more detail below with reference to FIG. 4.

In step 134 the logic blocks and cells are placed at the interior of the die. A main concern in performing this placement is to reduce spacing between cells, thereby minimizing the amount of wire routing that will need to be performed The main sub-steps in performing step 134 are partitioning, floorplaning and layout.

The logic portion of a chip may contain several million transistors. As a result, layout of the entire chip generally cannot be handled due to the limitations of available memory space and computation power. Therefore the logic circuitry normally is partitioned by grouping circuit components into blocks, such as subcircuits and modules. The actual partitioning process considers many factors such as the size of the blocks, number of blocks and number of interconnections between the blocks.

The output of partitioning is a set of blocks, together with the interconnections required between these blocks. In large circuits, the partitioning process is often hierarchical, although non-hierarchical (e.g. flat) processes can be used, and at the topmost level a circuit can have between 5 to 25 blocks. However, greater numbers of blocks are possible and contemplated. Each block is then partitioned recursively into smaller blocks.

Floor planning and placement are concerned with selecting good layout alternatives for each block of the entire chip, as well as between blocks and to the edges. Floor planning is a critical step as it sets up the ground work for a good layout During placement, the blocks are exactly positioned on the chip. The goal of placement is to find a minimum area arrangement for the blocks that allows completion of interconnections between the blocks. Placement is typically done in two phases. In the first phase, an initial placement is created. In the second phase, the initial placement is evaluated and iterative improvements are made until the layout has minimum area and conforms to design specifications.

In step 136, traces are routed from the I/O cells and interior logic cells to other I/O and interior logic cells, as well as to power and ground rings. The objective of routing is to complete all the interconnections between blocks according to the specified netlist, subject to the space available for routing. First, the space not occupied by blocks, which is called the routing space, is partitioned into rectangular regions called channels and switch boxes. The goal of a router is to complete all circuit connections using the shortest possible wire length and using only the channel and switch boxes.

Routing preferably is done in two phases referred to as the global routing and detailed routing phases. In global routing, connections are completed between the proper blocks of the circuit disregarding the exact geometric details of each wire and terminal. For each wire, a global router finds a list of channels that are to be used as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and their layer assignments. Detailed routing includes channel routing and switch box routing.

In addition to routing on the silicon substrate, the integrated circuit may be provided with one or more metal layers for routing. These metal layers are separated from the silicon layer and from each other by insulating layers, and can be used for forming metal traces. Electrical connections called vias are then made between the metal layers and the semiconductor substrate. Use of such metal layers often can free up space on the semiconductor substrate for implementing additional electronic devices.

In step 138, compaction is performed. Compaction is the process of compressing the layout in both directions such that the total area is reduced. By making the chips smaller, wire lengths are reduced, which in turn reduces the signal delay between components of the circuit. At the same time a smaller area enables more chips to be produced on a wafer, which in turn reduces the cost of manufacturing. Compaction must ensure that no rules regarding the design and fabrication processes are violated.

As is the case with the overall design cycle process, while the foregoing implementation of the physical design phase is preferable, other variations apparent to those skilled in the art may also be used. Moreover, although the steps are described above and shown in. FIG. 3 as being entirely sequential, it should be understood that feasibility problems discovered in any one of the steps frequently will require repeating a prior step. For example, routing problems discovered in step 136 might require adjustments to layout by re-executing portions of step 134.

I/O Cell and Pad Layout

I/O cell and pad layout will now be described in detail with reference to FIG. 4. Preferably, I/O cell and pad layout is performed using an automated placement, such as LSI Logic's Package Planner, modified as described below. Briefly, according to FIG. 4, the netlist and an ordered list of top-level signals from the netlist are input; physical dimensions and relative locations of the I/O cells, pads and connecting wires are obtained; corner I/O cells are placed; an initial spacing determination is made based on immediate-neighbor I/O cells; I/O cells are assembled for the current side of the die; spacing is modified based on row-neighbor I/O cells; the I/O cells are placed; and then the foregoing process is repeated for the remaining sides of the die.

In more detail, in step 170 the netlist is input from step 106 (shown in FIG. 2 above). Also, in this step the user provides an ordered list of the top-level signals dumped from the netlist. The order of the top-level signals designated by the user indicates the order in which I/O cells corresponding to those signals will appear in a counter-clockwise manner around the periphery of the die.

When determining how to order the top-level signals dumped from the netlist, the user may consider factors such as symmetry of design and adequacy of power supply for each segment of the power rings. With regard to power supply adequacy, the user typically also will insert power I/O cells and dummy instances not present in the netlist. Power I/O cells are placed to insure that each segment is adequately supplied. Each segment generally must have at least one VDD I/O power cell and at least one VSS I/O power cell, and may require more depending on the power requirements of the attached I/O cells. In addition, each segment must include at least two dummy instances. A dummy instance is a padless device which is provided for electrostatic discharge (ESD) protection. The ordered list supplied by the user may also include "skip" and/or "gap" statements, as described more fully below.

In step 172, information defining a topocell is retrieved from a library for each I/O signal in the user-supplied ordered list. The topocell information includes the physical dimensions of the cell. In the preferred embodiment, each I/O cell is rectangular in shape, and therefore the dimensions are given by specifying a lower-left and an upper-right corner, expressed in a relative coordinate system. The lower-left corner of each I/O cell is also referred to as the cell's F-mark As described in more detail below, placement of an I/O cell is performed mainly by reference to the cell's F-mark.

Also obtained from the library for each such I/O signal is information regarding the number and requirements of any pads required for the corresponding I/O cell. Based on this pad information, as well as information regarding pad design and exact pad position in the pad design, topocell information is retrieved for each such pad, the pad topocell information including dimensions and relative positions of both the pad and a wire for connecting the pad to the corresponding I/O device.

Figure 5A:
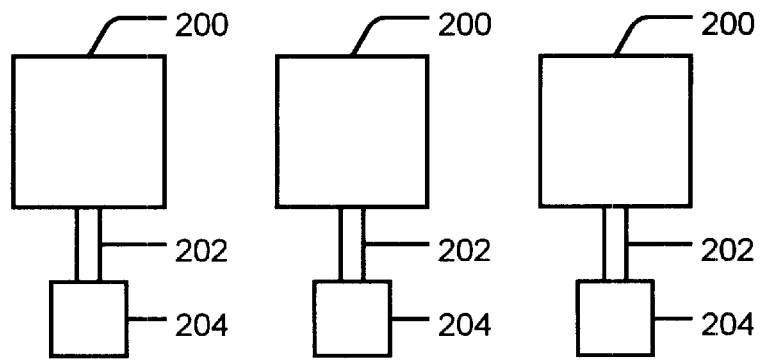
FIGS. 5A to 5C illustrate three possible pad designs which can be used in the practice of the invention.
Figure 5B:
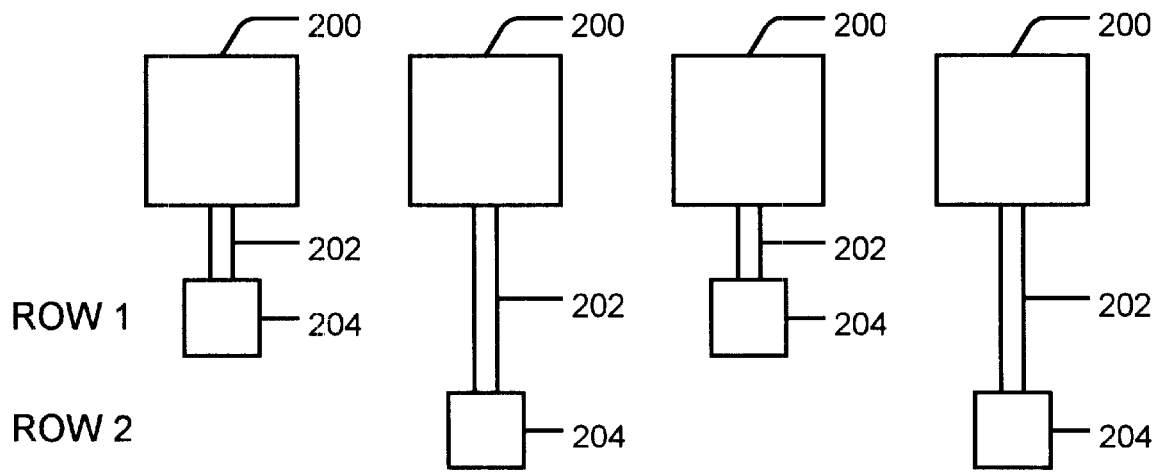
Figure 5C:
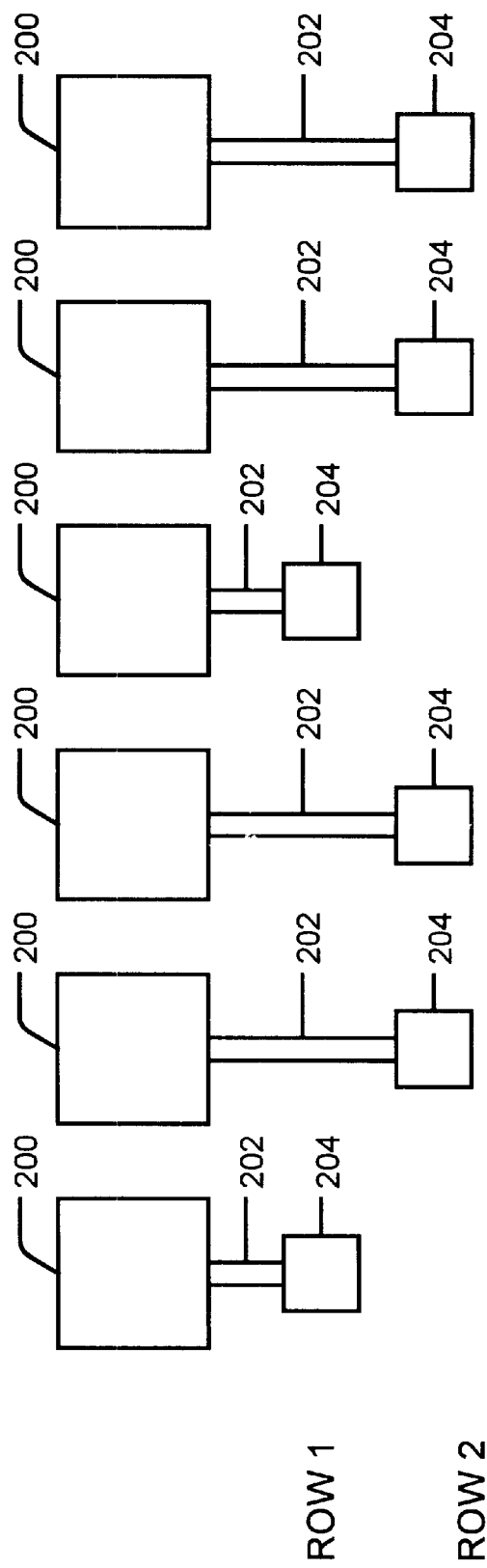
Figure 5D:
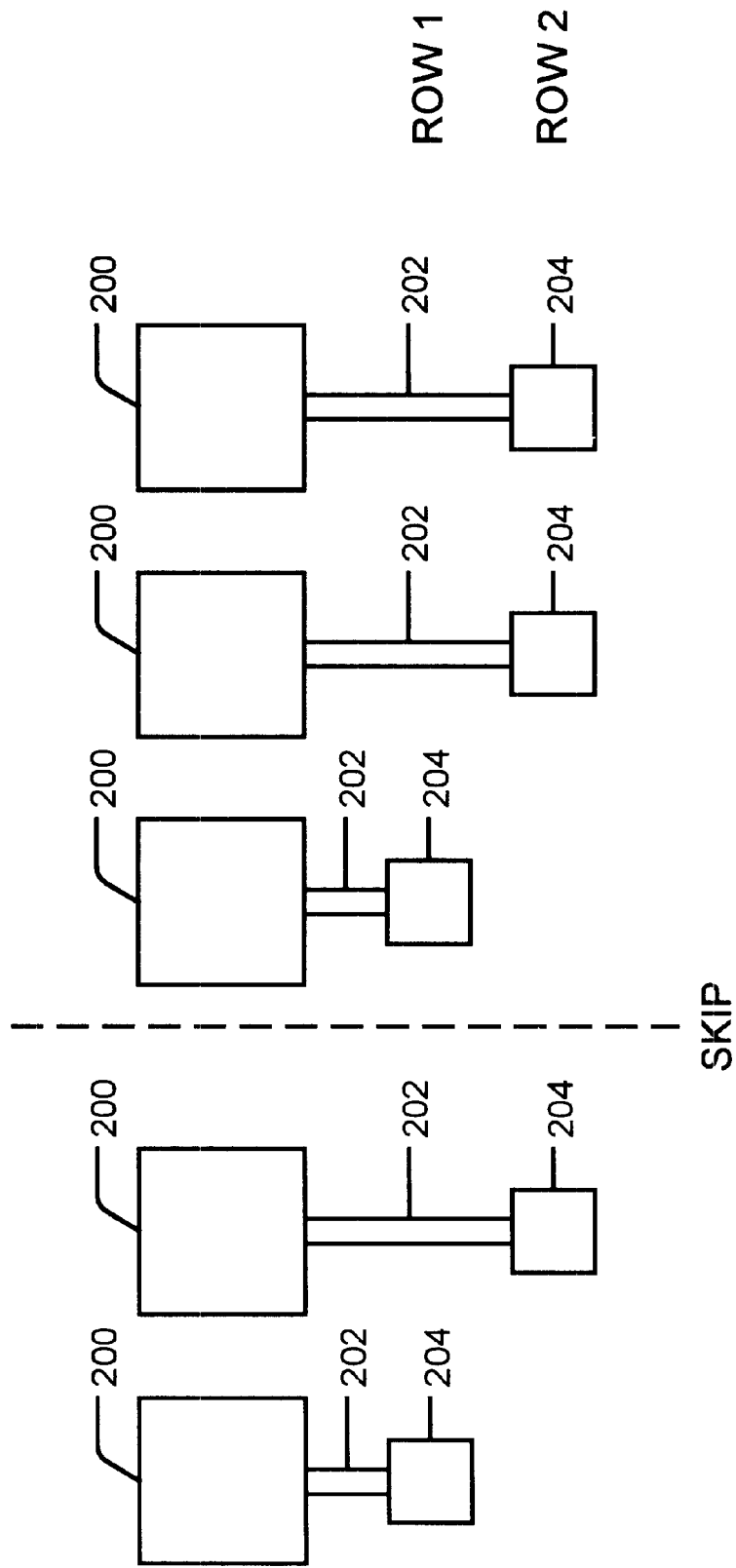
FIG. 5D illustrates the effect of a "skip" command on a pad design sequence.

To understand the significance of pad design information in selecting pad topocells, a brief description of pad design in the preferred embodiment is provided. FIGS. 5A to 5C illustrate three possible pad designs in which each I/O cell 200 has a single pad 204 connected by a wire 202. However, it should be understood that other pad designs instead may be used. As shown in FIG. 5A, the pad design may be in-ine, meaning that all pads 204 are placed in the same row. Alternatively, the pad design may be staggered, meaning that pads are placed in different rows, preferably in a pre-defined pattern. Thus, as shown in FIG. 5B, neighboring pads are placed alternately in Row 1 and Row 2 (i.e., a repeating 1–2 pattern). A somewhat different staggered design is illustrated in FIG. 5C, in which pads are staggered according to a 1-2-2 repeating pattern. Although the basic pattern is fixed, in the preferred embodiment of the invention the pre-defined pattern may be altered when the user specifies a "skip" command. A skip command skips the otherwise next position in the sequence. Thus, as shown in FIG. 5D, a skip command supplied by the user after the second top-level signal changes the {1-2-2-1-2-2 . . . } pattern in FIG. 5C to a {1-2-1-2-2 . . . } pattern.

By considering the pad design sequence, as well as the presence of any skip commands, it can be determined into which row each pad will be placed. In addition, referring to FIGS. 5A to 5C, it can be seen that wire length often will depend on the pad design used, as well as the pad's particular position within the design sequence. Finally, comparing FIGS. 5B to 5C, it can be seen that precisely where the wire is connected to the pad will also depend on these factors. Accordingly, it is preferable to provide a different topocell for each such different configuration.

As noted above, the obtained pad topocell includes information regarding the dimensions of the pads and the corresponding connecting wire. In the preferred embodiment, each pad and connecting wire also is rectangular in shape, and therefore these relative positions and dimensions are specified by providing a lower-left and an upper-right corner, expressed in a relative coordinate system, for each such element.

Returning to FIG. 4, in step 174 the corner I/O cells and pads are placed at predetermined positions in the corners of the die. Specifically, the relative coordinates of the F-mark for such I/O cells are mapped to absolute coordinates on the die corresponding to these predetermined corner positions. In the preferred embodiment, absolute coordinates on the die are defined with respect to an origin located at the lower-left corner of the die, with the die rotated in a predetermined orientation.

In step 176, each I/O cell for the current side of the die is assembled together with any pads required for the cell. This can be accomplished by mapping the coordinates of the I/O cell so that (1) the lower-left and upper-right corners of the I/O cell are expressed in the same relative coordinate system as the pad and wire and (2) the wire will connect to the I/O cell at the appropriate position on the I/O cell. The F-mark of the I/O cell, as so mapped, will continue to serve as the main reference point for placing the cell and its associated wires and pads.

In step 178, an initial spacing determination is made for each I/O cell on the current side of the die. This initial spacing determination is made by performing a tightest possible fit while considering factors such as pad layout, device overlap, pad spacing criteria, and any user-supplied "skip" and "gap" statements. The goal in this step is to produce a layout having the minimum acceptable spacing between each I/O cell and its immediate neighbors, that is, the cell that is closest to the current cell in one direction along the side of the die and the cell that is closest to the current cell in the other direction along the side of the die. An overriding consideration in placing I/O cells and pads is the pad design selected and the particular pa location within the design sequence.

Figure 6:
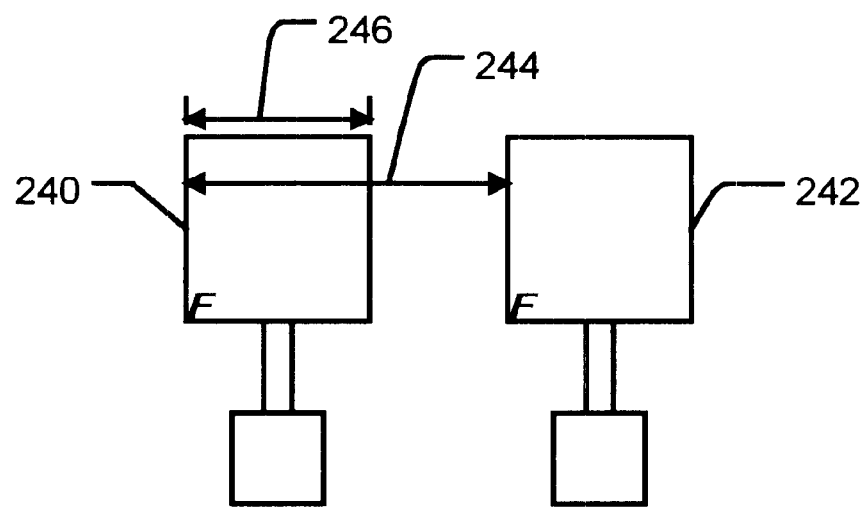
FIG. 6 illustrates a criterion for prevention of I/O device overlap, according to the preferred embodiment of the invention

As indicated above, in order to achieve minimum acceptable F-mark spacing in this step, several different criteria must be considered. The criterion which results in the largest required spacing between two neighboring I/O cells will then be selected as the minimum acceptable spacing between those two for purposes of this step. Toward this end, the first consideration is the prevention of I/O device overlap. This consideration is illustrated in FIG. 6. As shown in FIG. 6, in the preferred embodiment the I/O devices are placed in a single row. Accordingly, the minimum horizontal separation 244 between the F-marks of the current I/O cell 240 and the next I/O cell 242 must be greater than the width of the current I/O cell, i.e., the difference between the x coordinates of the upper-right and lower-left corners of the current I/O cell 240.

The next consideration is immediate-neighbor pad spacing. The specific criteria utilized in this regard depend on the row numbers of the current and next pad, on the type of pad design employed, and on the existence of any "skip" statements.

Figure 7A:
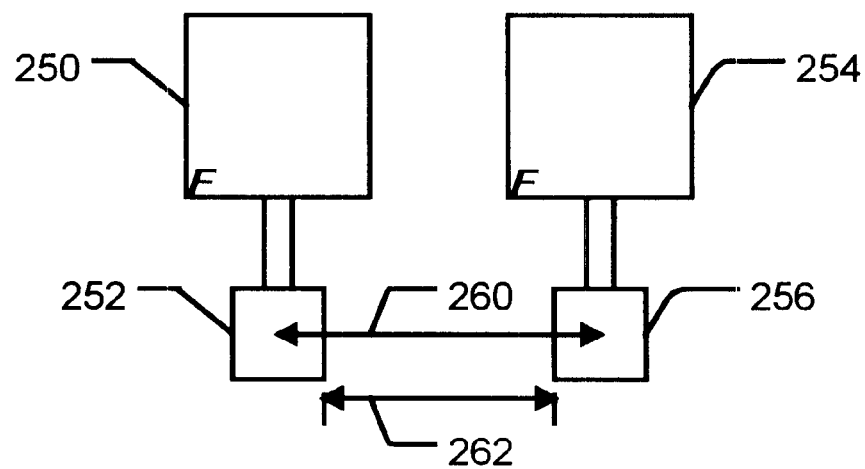
FIG. 7A illustrates the immediate-neighbor pad pitch and pad-to-pad spacing criteria according to the preferred embodiment of the invention.

For in-line designs, the immediate-neighbor pad spacing requirement specifies that the current pad and the next pad satisfy minimum pad pitch and minimum pad-to-pad spacing criteria. These criteria are illustrated in FIG. 7A which shows a current I/O cell 250 and pad 252 and a next I/O cell 254 and pad 256. As shown in FIG. 7A, pad pitch (i.e., center-to-center spacing) between neighboring pads 252 and 256 must be greater than a predetermined minimum distance 260. In addition, pad-to-pad spacing (i.e., between the closest edges of the pads) between the current pad 252 and the next pad 256 must be greater than a predetermined minimum distance 262. Preferably, minimum pad pitch and minimum pad-to-pad spacing are obtained from a library based on the particular technology used, an average pad pitch specified by the user, and the pad design used.

As noted above, the relative lower-left and upper-right corners of the current I/O cell 250 and pad 252, as well as the relative lower-left and upper-right corners of the next I/O cell 254 and pad 256, are known. It is therefore a simple matter to mathematically convert each of the minimum pad pitch and minimum pad-to-pad spacing criteria into two corresponding minimum spacings between the F-mark of current I/O cell and the F-mark of its immediate-neighbor I/O cell.

Figure 7B:
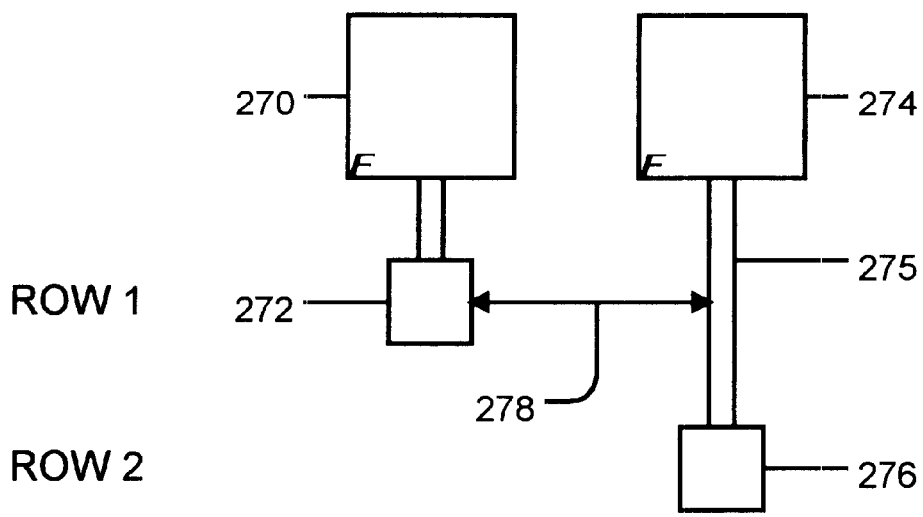
FIGS. 7B and 7C illustrate the immediate-neighbor pad-to-metal spacing criterion, as well as the applicability thereof according to the preferred embodiment of the invention.
Figure 7C:
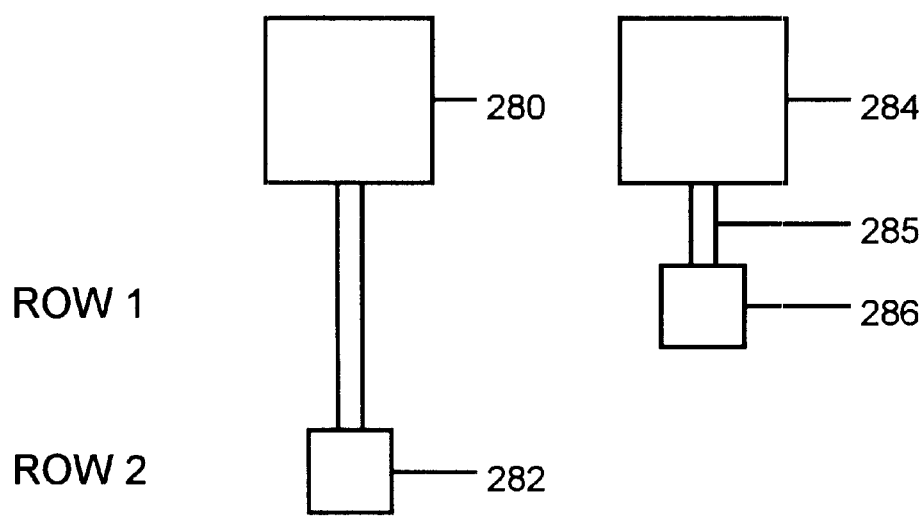

For staggered designs, the immediate-neighbor pad spacing requirement specifies that the spacing between the closest edges of the current pad and the wire connecting the next pad to the next I/O cell be greater than a predetermined distance,(i.e., minimum pad-to-metal spacing). However, this pad spacing criterion is applied only if the row number of the current pad is less than the row number for the next pad, where higher numbered rows are closer to the edge of the IC die than lower numbered rows. Thus, referring to FIG. 7B, I/O cell 270 is the current I/O cell, pad 272 is the current pad, I/O cell 274 is the next I/O cell, and 276 is the next pad. Because pad 272 is in Row 1 and pad 276 is in Row 2, the pad spacing criterion for neighboring pads is applied. However, referring to FIG. 7C, current I/O pad 282 is in Row 2 and next pad 286 is in Row 1. As a result, the pad spacing requirement for immediate-neighbor pads is not applied. Likewise, the pad spacing requirement for immediate-neighbor pads is not applied if the current and next pads are in the same row.

The application of the immediate-neighbor pad spacing requirement for staggered pad designs can be seen by referring again to FIG. 7B. Specifically, spacing 278 between the closest edges of current pad 272 and the next wire 275 must be greater than a predetermined minimum distance. The lower-left and upper-right corner relative positions of pad 272, I/O cell 270, wire 275 and I/O cell 274, as well as the location at which wire 275 connects to I/O cell 274, are known. Therefore, it is a simple matter to mathematically convert the minimum pad-to-metal spacing criterion into a minimum spacing requirement between the F-marks for I/O cells 270 and 274. Similar to the other minimum spacing requirements, the minimum pad-to-metal spacing preferably is obtained from a library based on the particular technology used, an average pad pitch specified by the user, and the pad design used.

Although a corresponding metal-to-pad spacing criterion is not utilized in this embodiment of the invention, it should be noted that such a criterion also may be included. In this case, if the current pad has a higher row number than its immediate- neighbor pad, then a distance between the wire for the current pad and the next pad may be subject to a minimum spacing requirement In particular, the distance may be measured from the closest edges of the current wire and the next pad.

Finally, regardless of pad design, any "gap" statements supplied by the user must be considered. A "gap" statement is a statement of a required minimum spacing between F-marks of particular adjacent I/O cells, specified by the user.

Summarizing the above requirements, for in-line pad designs the minimum spacing between the F-marks of the current and next I/O cells in this step will be the maximum of the: (1) minimum spacing distance calculated based device overlap, (2) minimum immediate-neighbor pad pitch spacing, (3) minimum immediate-neighbor pad-to-pad spacing, and (4) any gap specified by the user. For staggered designs, the minimum spacing between the F-marks of the current and next I/O cells will be the maximum of the: (1) minimum spacing distance calculated based on device overlap, (2) minimum immediate-neighbor pad-to-metal spacing, if applicable, and (3) any gap specified by the user.

Figure 4:
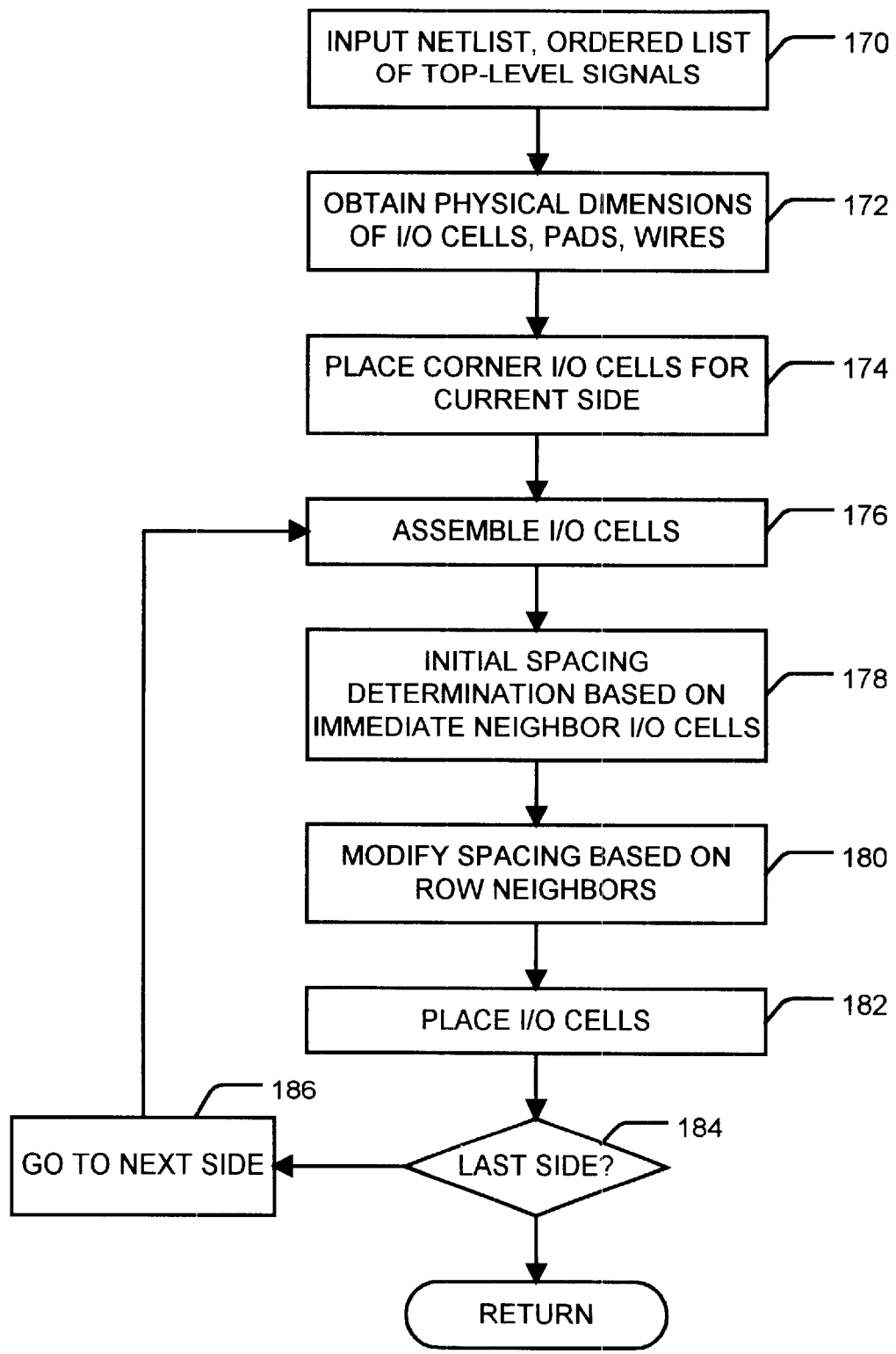
FIG. 4 is a flow diagram for explaining layout of input/output cells and bonding pads according to the preferred embodiment of the invention.

If the tightest possible fit obtained by using the spacings obtained in this step will fit on the current side of the die, then processing proceeds to step 180 in FIG. 4. Otherwise, an error message is returned.

Referring again to FIG. 4, in step 180 the spacings determined in step 178 are modified based on row-neighbor requirements, i.e., spacing requirements between the current pad and the next pad in the same row. Because only one pad row is used for in-line pad designs, this step can be bypassed for in-line design cases. For staggered pad designs, the current pad and the next pad in the same row as the current pad (referred to as the current pad's "row-neighbor") must satisfy minimum pad pitch and minimum pad-to-pad spacing criteria, as follows.

Figure 8:
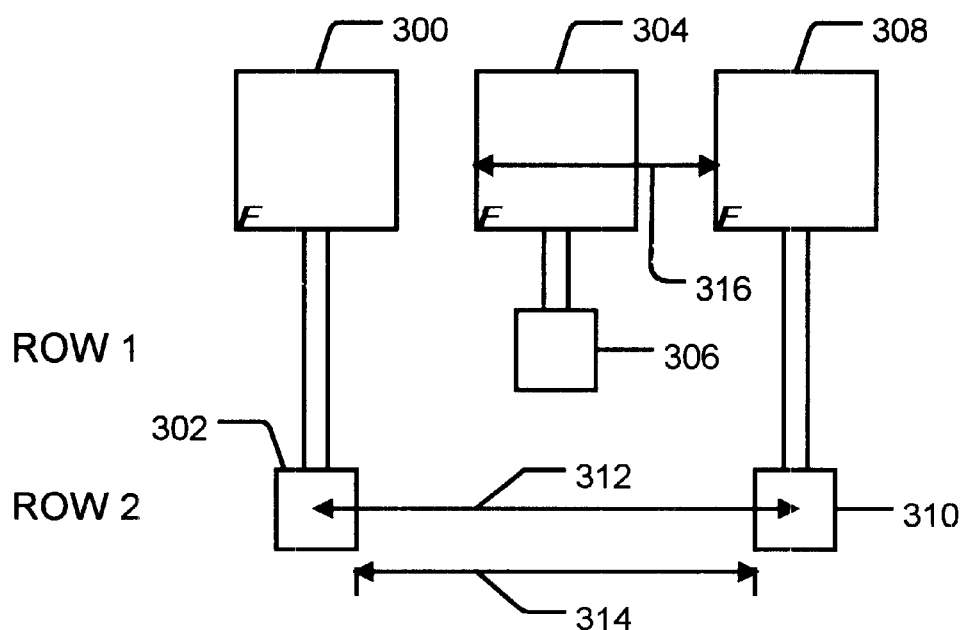
FIG. 8 illustrates the row-neighbor pad pitch and pad-to-pad spacing criteria, according to the preferred embodiment of the invention.

FIG. 8 illustrates the row-neighbor requirements according to the preferred embodiment of the invention. Specifically, FIG. 8 shows current I/O cell 300 and pad 302, next I/O cell 304 and next pad 306, and the following I/O cell 308 and pad 310. Because current pad 302 is in Row 1, pad 306 is in Row 2, and pad 310 is in Row 1, pad 310 is the next pad in the same row as current pad 302. The minimum pad pitch and minimum pad-to-pad spacing criteria therefore must be satisfied between pads 302 and 310. Referring to FIG. 8, spacing 312 must be greater than a predetermined minimum row-neighbor pad pitch, and spacing 314 must be greater Man a predetermined minimum row-neighbor pad-to-pad spacing. In the preferred embodiment of the invention, the predetermined minimum row-neighbor pad pitch and pad-to-pad spacings are the same as the minimum immediate-neighbor pad pitch and pad-to-pad spacings, respectively, used in step 178 above.

As noted above, the relative lower-left and upper-right corners of the current I/O cell 300 and pad 302, as well as the relative lower-left and upper-right corners of the row-neighbor I/O cell 308 and pad 310 are known. It is therefore a simple matter to mathematically convert each of the minimum pad pitch and minimum pad-to-pad spacing criteria into two corresponding minimum spacings between the F-mark of current I/O cell 300 and the F-mark of its row-neighbor, I/O cell 308. From the maximum of these two minimum F-mark spacings (referred to as the "minimum row-neighbor F-mark spacing"), an aggregate minimum spacing value is subtracted. For purposes of this calculation, the aggregate minimum spacing value is defined as the sum of the minimum F-mark spacings determined in step 178 for immediate-neighbor pairs of I/O cells beginning with the I/O cell that is the immediate-neighbor of the current I/O cell and ending with the row neighbor of the current I/O cell. Referring to FIG. 8, there is only one pair of immediate-neighbor I/O cells beginning with the immediate-neighbor to the current I/O cell. Accordingly, only the minimum spacing 316 (determined in step 178) is subtracted from the minimum row-neighbor F-mark spacing for current I/O cell 300.

If the result of the foregoing subtraction is greater than the minimum F-mark spacing between the current and next I/O cell determined in step 178, then this minimum F-mark spacing is made equal to this subtraction result. Otherwise, the minimum F-mark spacing between the current and next I/O cells remains unchanged.

If the tightest possible fit obtained by using the F-mark spacings obtained in this step will fit on the current side of the die, then processing proceeds to step 182. Otherwise, an error message is returned.

In step 182, all the I/O cells for the current side are placed on the die as follows. First, the amount of remaining space is determined as the difference between the length of the current side of the die minus the space required by the tightest possible fit. The amount of remaining space is uniformly distributed among the minimum F-mark spacings determined in step 180 to obtain actual F-mark spacings which spread out the I/O devices along the entire length of the current side of the die. Then, the I/O cells are placed along the side of the die based on these actual F-mark spacings.

In step 184, it is determined whether I/O cells have been placed for all sides of the die. If so, processing proceeds to step 134 of the physical design process, as shown in FIG. 3. Otherwise, the next side is selected in step 186 and then processing returns to step 174 to assemble the I/O cells for that side.

Fabrication

Upon completion of design, as described above, the integrated circuit can be fabricated using the masks generated in step 108, but otherwise employing conventional fabrication techniques. During fabrication, the masks generated in step 108 are used to pattern a silicon wafer using a sequence of photolithographic steps. Photolithography is a common technique employed in the manufacture of semiconductor devices. Typically, a semiconductor wafer is coated with a layer (film) of light-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern on the mask.

The above-mentioned "wafer" is a thin piece of semiconductor material from which semiconductor chips are made. The four basic operations utilized to fabricate wafers include (1) layering, (2) patterning, (3) doping and (4) heat treatments.

The layering operation adds thin layers of material including insulators, semiconductors, and conductors, to a wafer surface. During the layering operation, layers are either grown or deposited. Oxidation typically involves growing a silicon dioxide (an insulator) layer on a silicon wafer. Deposition techniques include, for, example, chemical vapor deposition, evaporation, and sputtering. Semiconductors are generally deposited by chemical vapor deposition, while conductors are generally deposited with evaporation or sputtering.

Pattering involves the removal of selected portions of surface layers. After material is removed, the wafer surface has a pattern The material removed may form a hole or an island. The process of patterning is also known to those skilled in the relevant art as microlithography, photolithography, photomasking and masking. The patterning operation serves to create parts of the semiconductor device on the wafer surface in the dimensions required by the circuit design and to locate the parts in their proper location on the wafer surface.

Doping involves implanting dopants in the surface of the wafer through openings in the layers to create the n-type and p-type pockets needed to form the N-P junctions for operation of discrete elements such as transistors and diodes. Doping generally is achieved with thermal diffusion (wafer is heated and exposed to the desired dopant) and ion implantation (dopant atoms are ionized, accelerated to high velocities and implanted into the wafer surface).

Design System Environment

Figure 9:
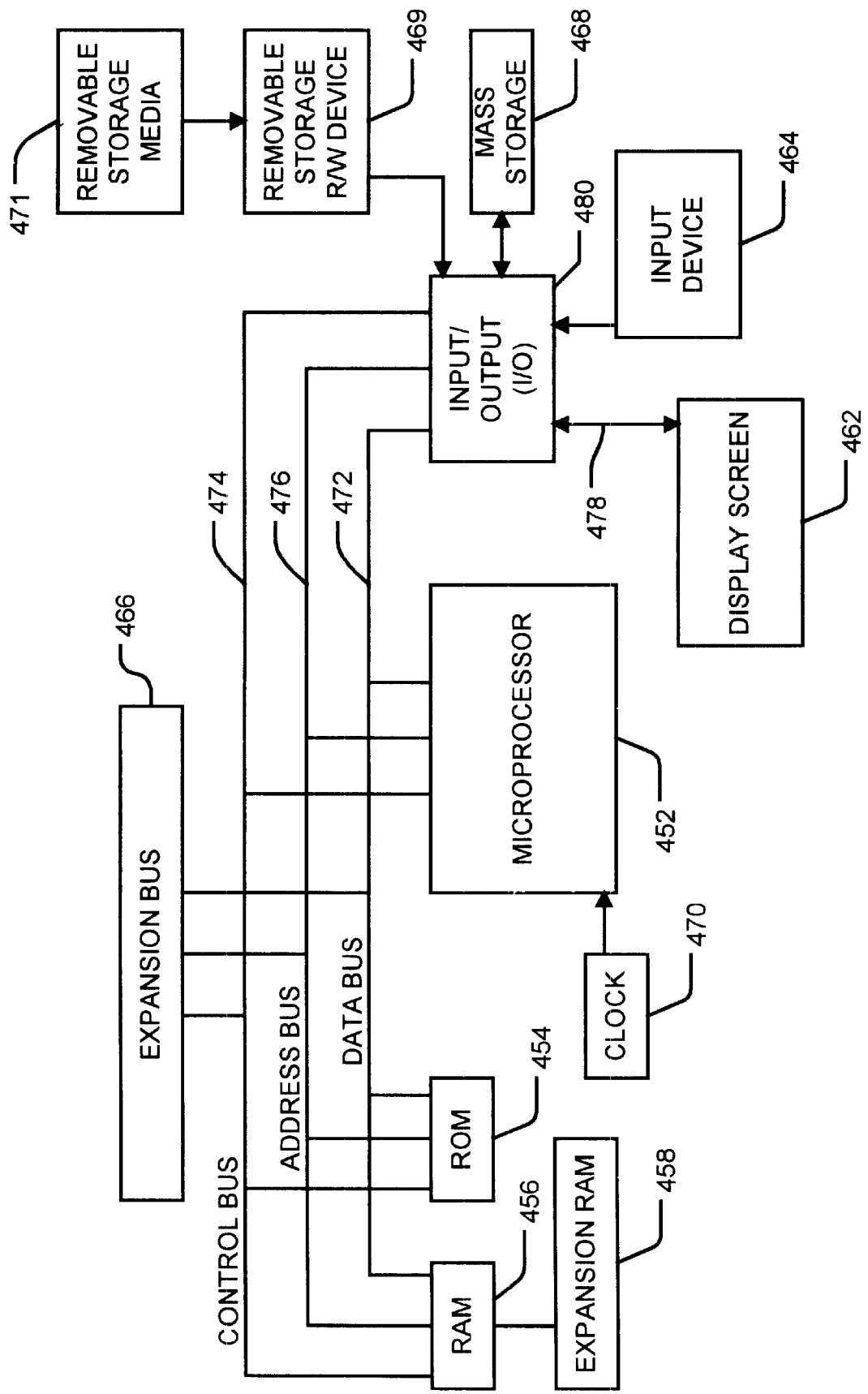
FIG. 9 is block diagram of a general purpose computer system, representing one suitable computer platform for implementing the methods of the invention.

Generally, the methods described herein with respect to IC design will be practiced with a general purpose computer, either with a single processor or multiple processors. FIG. 9 is block diagram of a general purpose computer system, representing one of many suitable computer platforms for implementing the methods described above. FIG. 9 shows a general purpose computer system 450 in accordance with the present invention. As shown in FIG. 9, computer system 450 includes a central processing unit (CPU) 452, read-only memory (ROM) 454, random access memory (RAM) 456, expansion RAM 458, input/output (I/O) circuitry 460, display assembly 462, input device 464, and expansion bus 466. Computer system 450 may also optionally include a mass storage unit 468 such as a disk drive unit or nonvolatile memory such as flash memory and a real-time clock 470.

CPU 452 is coupled to ROM 454 by a data bus 472, control bus 474, and address bus 476. ROM 454 contains the basic operating system for the computer system 450. CPU 452 is also connected to RAM 456 by busses 472, 474, and 476. Expansion RAM 458 is optionally coupled to RAM 456 for use by CPU 452. CPU 452 is also coupled to the I/O circuitry 460 by data bus 472, control bus 474, and address bus 476 to permit data transfers with peripheral devices.

I/O circuitry 460 typically includes a number of latches, registers and direct memory access (DMA) controllers. The purpose of I/O circuitry 460 is to provide an interface between CPU 452 and such peripheral devices as display assembly 462, input device 464, and mass storage 468.

Display assembly 462 of computer system 450 is an output device coupled to I/O circuitry 460 by a data bus 478. Display assembly 462 receives data from I/O circuitry 460 via bus 478 and displays that data on a suitable screen.

The screen for display assembly 462 can be a device that uses a cathode-ray tube (CRT), liquid crystal display (LCD), or the like, of the types commercially available from a variety of manufacturers. Input device 464 can be a keyboard, a mouse, a stylus working in cooperation with a position-sensing display, or the like. The aforementioned input devices are available from a variety of vendors and are well known in the art.

Some type of mass storage 468 is generally considered desirable. However, mass storage 468 can be eliminated by providing a sufficient mount of RAM 456 and expansion RAM 458 to store user application programs and data In that case, RAMs 456 and 458 can optionally be provided with a backup battery to prevent the loss of data even when computer system 450 is turned off. However, it is generally desirable to have some type of long term mass storage 468 such as a commercially available hard disk drive, nonvolatile memory such as flash memory, battery backed RAM, PC-data cards, or the like.

A removable storage read/write device 469 may be coupled to I/O circutry 460 to read from and to write to a removable storage media 471. Removable storage media 471 may represent, for example, a magnetic disk, a magnetic tape, an opto-magnetic disk, an optical disk, or the like. Instructions for implementing the inventive method may be provided, in one embodiment, to a network via such a removable storage media In operation, information is input into the computer system 450 by typing on a keyboard, manipulating a mouse or trackball, or "writing" on a tablet or on position-sensing screen of display assembly 462. CPU 452 then processes the data under control of an operating system and an application program, such as a program to perform steps of the inventive method described above, stored in ROM 454 and/or RAM 456. CPU 452 then typically produces data which is output to the display assembly 462 to produce appropriate images on its screen.

Expansion bus 466 is coupled to data bus 472, control bus 474, and address bus 476. Expansion bus 466 provides extra ports to couple devices such as network interface circuits, modems, display switches, microphones, speakers, etc. to CPU 452. Network communication is accomplished through the network interface circuit and an appropriate network.

Suitable computers for use in implementing the present invention may be obtained from various vendors. Various computers, however, may be used depending upon the size and complexity of the OPC tasks. Suitable computers include mainframe computers, multiprocessor computers, workstations or personal computers. In addition, although a general purpose computer system has been described above, a special-purpose computer may also be used.

It should be understood that the present invention also relates to machine readable media on which are stored program instructions for performing methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiments shown in the drawings and described in detail above. Therefore it is intended that all such variations not departing from the spirit of the invention be considered as within the scope thereof as limited solely by the claims appended hereto.

In the following claims, those elements which do not include the words "means for" are intended not to be interpreted under 35 U.S.C. §112 ¶6.

What is claimed is:

1. An apparatus for laying out input/output (I/O) pairs, each comprising an I/O cell and a pad, on an integrated circuit die, said apparatus comprising:
   a processor for executing stored program instruction steps; and
   a memory connected to the processor for storing the program instruction steps,
   wherein the program instruction steps include steps to:
   (1) obtain plural I/O pairs, wherein each I/O pair includes layout information for an I/O cell, a pad and a connection between the I/O cell and the pad;
   (2) obtain cell, pad and connection information for each of a first I/O pair and a second I/O pair;
   (3) determine a minimum spacing criterion which specifies a minimum distance between the first I/O pair and the second I/O pair, wherein the minimum spacing criterion is based on the cell, pad and connection information for each of the first I/O pair and the second I/O pair; and
   (4) layout the first I/O pair and the second I/O pair so as to satisfy the minimum spacing criterion.

2. An apparatus according to claim 1, wherein the minimum spacing criterion is based on a minimum separation between the I/O cells in the first and second I/O pairs.

3. An apparatus according to claim 1, wherein step (1) comprises inputting an ordered list of signals and assembling the plural I/O pairs based on the ordered list of signals.

4. An apparatus according to claim 1, wherein the minimum spacing criterion is based on a property of the I/O cells in the first and second I/O pairs.

5. Computer-executable process steps stored on a computer readable medium, said process steps for laying out input/output (I/O) pairs, each comprising an I/O cell and a pad, on an integrated circuit die, said process steps comprising steps to:
   (1) obtain plural I/O pairs, wherein each I/O pair includes layout information for an I/O cell, a pad and a connection between the I/O cell and the pad;
   (2) obtain cell, pad and connection information for each of a first I/O pair and a second I/O pair;
   (3) determine a minimum spacing criterion which specifies a minimum distance between the first I/O pair and the second I/O pair, wherein the minimum spacing criterion is based on the cell, pad and connection information for each of the first I/O pair and the second I/O pair; and
   (4) layout the first I/O pair and the second I/O pair so as to satisfy the minimum spacing criterion.

6. Computer-executable process steps according to claim 5, wherein the minimum spacing criterion is based on a minimum separation between the I/O cells in the first and second I/O pairs.

7. Computer-executable process steps according to claim 5, wherein step (1) comprises inputting an ordered list of signals and assembling the plural I/O pairs based on the ordered list of signals.

8. Computer-executable process steps according to claim 5, wherein the minimum spacing criterion is based on a property of the I/O cells in the first and second I/O pairs.

9. An apparatus for laying out input/output (I/O) pairs, each comprising an I/O cell and a pad, on an integrated circuit die, said apparatus comprising:
   (1) means for obtaining plural I/O pairs, wherein each I/O pair includes layout information for an I/O cell, a pad and a connection between the I/O cell and the pad;
   (2) means for obtaining cell, pad and connection information for each of a first I/O pair and a second I/O pair;
   (3) means for determining a minimum spacing criterion which specifies a minimum distance between the first I/O pair and the second I/O pair, wherein the minimum spacing criterion is based on the cell, pad and connection information for each of the first I/O pair and the second I/O pair; and
   (4) means for laying out the first I/O pair and the second I/O pair so as to satisfy the minimum spacing criterion.

10. An apparatus according to claim 9, wherein the minimum spacing criterion is based on a minimum separation between the I/O cells in the first and second I/O pairs.

11. An apparatus according to claim 9, wherein said means (1) comprises means for inputting an ordered list of signals and means for assembling the plural I/O pairs based on the ordered list of signals.

12. An apparatus according to claim 9, wherein the minimum spacing criterion is based on a property of the I/O cells in the first and second I/O pairs.

* * * * *